United States Patent [19]

Tanaka et al.

[11] Patent Number: 5,262,295
[45] Date of Patent: Nov. 16, 1993

[54] HEAT-DEVELOPABLE PHOTOSENSITIVE MATERIAL AND IMAGE FORMING METHOD MAKING USE OF THE HEAT-DEVELOPABLE PHOTOSENSITIVE MATERIAL

[75] Inventors: Hiromi Tanaka, Atsugi; Tetsuro Fukui, Kawasaki; Kenji Kagami, Atsugi; Masao Suzuki, Tokyo, all of Japan

[73] Assignee: Canon Kabushiki Kaisha, Tokyo, Japan

[21] Appl. No.: 868,105

[22] Filed: Apr. 14, 1992

[30] Foreign Application Priority Data

Apr. 15, 1991 [JP] Japan .................. 3-108135

[51] Int. Cl.⁵ .................. G03C 1/00; G03C 1/06
[52] U.S. Cl. .................. 430/619; 430/203; 430/213; 430/217; 430/270; 430/254; 430/328; 430/354; 430/353
[58] Field of Search ............... 430/203, 353, 619, 620, 430/213, 254, 217, 270, 328

[56] References Cited

U.S. PATENT DOCUMENTS

| | | | |
|---|---|---|---|
| 2,681,294 | 6/1954 | Beguin | |
| 3,547,648 | 12/1970 | Sagawa | 96/94 |
| 4,123,274 | 10/1978 | Knight et al. | 96/66 T |
| 4,211,839 | 7/1980 | Suzuki et al. | 430/619 |
| 4,220,709 | 9/1980 | deMauriac | 430/353 |
| 5,001,032 | 3/1991 | Katayama et al. | 430/203 |
| 5,004,667 | 4/1991 | Arahara et al. | 430/255 |
| 5,021,321 | 6/1991 | Fukui et al. | 430/201 |
| 5,064,744 | 11/1991 | Fukui et al. | 430/255 |

FOREIGN PATENT DOCUMENTS

| | | |
|---|---|---|
| 326424 | 8/1989 | European Pat. Off. |
| 2641964 | 3/1977 | Fed. Rep. of Germany |
| 58-118638 | 7/1983 | Japan |
| 58-118639 | 7/1983 | Japan |
| 59-55429 | 3/1984 | Japan |
| 3-135564 | 6/1991 | Japan |

*Primary Examiner*—Charles L. Bowers, Jr.
*Assistant Examiner*—Thorl Chea
*Attorney, Agent, or Firm*—Fitzpatrick, Cella, Harper & Scinto

[57] ABSTRACT

A heat-developable photosensitive material is disclosed which has a support and provided thereon a photosensitive layer. The photosensitive layer contains at least an organic silver salt, a silver halide and a reducing agent represented by the formula (I). Also, an image forming method using the heat-developable photosensitive material is disclosed.

10 Claims, 3 Drawing Sheets

HEAT-DEVELOPABLE PHOTOSENSITIVE MATERIAL AND IMAGE FORMING METHOD MAKING USE OF THE HEAT-DEVELOPABLE PHOTOSENSITIVE MATERIAL

BACKGROUND OF THE INVENTION

1. Field of the Invention

The present invention relates to a heat-developable photosensitive material containing an organic silver salt. It also relates to an image forming method making use of such a heat-developable photosensitive material.

2. Related Background Art

Hitherto known silver salt photography making use of a photosensitive silver halide can achieve excellent sensitivity and gradation, and is a recording technique having been most widely put into practical use. This photography, however, makes use of a wet process in the processing steps such as developing, fixing and washing, and hence has many problems on operability and safety such that it takes much labor and time for the processing and chemicals used for the processing may give anxiety for influence on human bodies.

As a countermeasure therefor, research has been extensively made in relation to dry processing photography eliminating the wet process, as disclosed in Japanese Patent Publications No. 43-4921, No. 43-4924, etc. These disclosures are concerned with a technique in which a photosensitive silver halide is used in an amount corresponding to the amount required for a catalyst and a non-photosensitive organic silver salt is used as an image forming agent. The mechanism by which the organic silver salt acts as an image forming agent can be explained as follows: (1) A silver nucleus is produced from a photosensitive silver halide as a result of exposure, and it forms a latent image. (2) The silver nucleus serves as a catalyst, for an organic silver salt and a reducing agent which cause oxidation-reduction reaction upon heating, and the organic silver salt is reduced to metallic silver, which forms a visible image.

As an example of methods of utilizing such a heat-developable photosensitive material, Japanese Patent Application Laid-open No. 55-50246 discloses a method of use as a mask. In this method, a silver image is used as a mask. Silver images formed using such conventional heat-developable photosensitive materials have been disadvantageous in that they are reddish and can not be pure-black.

Because of an advantage of the heat-developable photosensitive material over the wet-process silver salt photosensitive material in view of the fact that the former requires no wet processing, it has been sought to make contrast and raw stock stability comparable to, or more improve them than, those of the wet-process photosensitive materials (the raw stock stability is the properties by which photosensitive materials can be stored in such a state that its photographic performance immediately after manufacture is retained as it is).

Meanwhile, the present assignee has disclosed in Japanese Patent Application Laid-open No. 3-135564 a photosensitive material that utilizes light absorption of a light-absorbing organic compound to form an image. This light-absorbing organic compound is an oxidized product of a reducing agent.

SUMMARY OF THE INVENTION

The present invention was made taking account of such existing circumstances. An object thereof is to provide a heat-developable (dry-process silver salt) photosensitive material that can form an image with a good contrast and also has a superior raw stock stability, and an image forming method making use of such a heat-developable photosensitive material.

Another object of the present invention is to provide a heat-developable photosensitive material capable of forming an image that can be substantially pure-black at its black area, and an image forming method making use of such a heat-developable photosensitive material.

The heat-developable photosensitive material of the present invention comprises a support and provided thereon a photosensitive layer containing at least an organic silver salt, a silver halide and a reducing agent represented by the following formula (I):

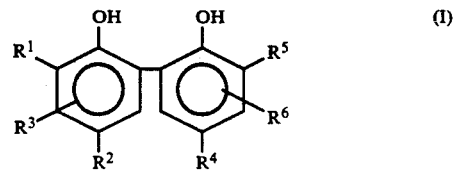

wherein $R^1$, $R^2$, $R^3$, $R^4$, $R^5$ and $R^6$ each represent a hydrogen atom, a halogen atom, a substituted or unsubstituted alkyl group, a substituted or unsubstituted aryl group, a substituted or unsubstituted cycloalkyl group, a substituted or unsubstituted aralkyl group or a substituted or unsubstituted alkoxyl group, and $R^1$, $R^2$, $R^3$, $R^4$, $R^5$ and $R^6$ may be the same or different from one another.

In the heat-developable photosensitive material of the present invention, the photosensitive layer described above may contain a polymerizable polymer precursor and a photopolymerization initiator. Alternatively, a polymerizing layer containing a polymerizable polymer precursor and a photopolymerization initiator may be provided in addition to the photosensitive layer described above.

The image forming method of the present invention comprises subjecting the above heat-developable photosensitive material to imagewise exposure and heating, and further optionally to polymerization exposure.

DESCRIPTION OF THE PREFERRED EMBODIMENTS

Figure 1:
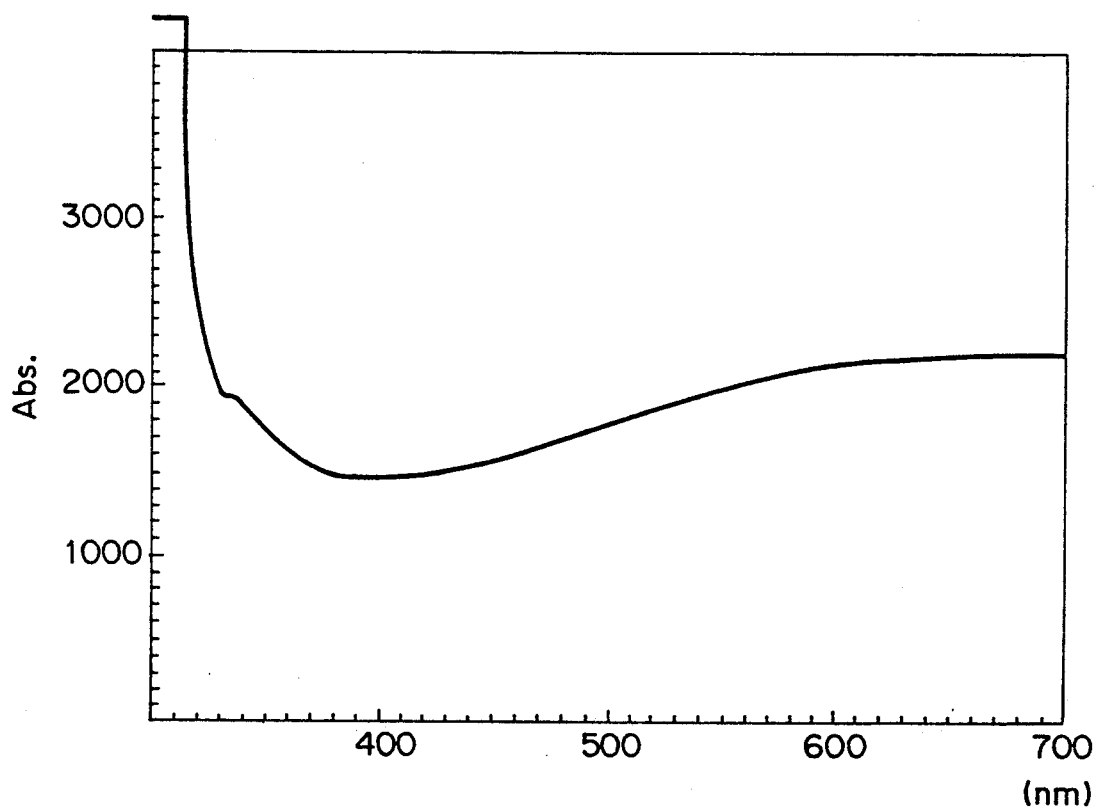
FIG. 1 is a graph to show spectral properties at an imagewise exposed area of photosensitive material A according to the present invention, prepared in Example 1.

The heat-developable photosensitive material of the present invention comprises a support and a photosensitive layer provided thereon. The photosensitive layer contains an organic silver salt, a silver halide and a reducing agent represented by the following formula (I), and also optionally a polymerizable polymer precursor and a photopolymerization initiator.

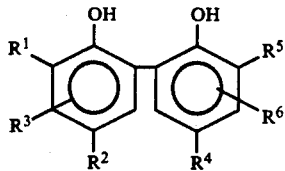

In the formula, $R^1$, $R^2$, $R^3$, $R^4$, $R^5$ and $R^6$ each represent a hydrogen atom, a halogen atom, a substituted or unsubstituted alkyl group, a substituted or unsubstituted aryl group, a substituted or unsubstituted cycloalkyl group, a substituted or unsubstituted aralkyl group or a substituted or unsubstituted alkoxyl group. $R^1$, $R^2$, $R^3$, $R^4$, $R^5$ and $R^6$ may be the same or different from one another.

The present invention, which employs the reducing agent represented by the formula (I), makes it possible to achieve a high optical density at imagewise exposed areas, causing less fogging at imagewise unexposed areas, and to stably obtain images with a good contrast.

$R^1$, $R^2$, $R^3$, $R^4$, $R^5$ and $R^6$ are as defined above, among which $R^1$ and $R^5$ each preferably represent a halogen atom, a substituted or unsubstituted alkyl group, a substituted or unsubstituted cycloalkyl group, a substituted or unsubstituted aralkyl group or a substituted or unsubstituted alkoxyl group, and more preferably a substituted or unsubstituted alkyl group. In particular, $R^1$ and $R^5$ each preferably represent a branched alkyl group.

The halogen atom may include, for example, fluorine, chlorine, bromine and iodine.

The unsubstituted alkyl group may preferably include a straight-chain or branched alkyl group having 1 to 18, and more preferably 1 to 18 carbon atoms, as exemplified by methyl, ethyl, propyl, butyl, i-butyl, t-butyl, amyl, i-amyl, sec-amyl, hexyl, t-octyl, texyl, heptyl, octyl, nonyl, dodecyl, stearyl or behenyl.

The substituted alkyl group may preferably include an alkoxyalkyl group having 2 to 18, and more preferably 2 to 10, carbon atoms, a halogenoalkyl group having 1 to 18, and more preferably 1 to 6, carbon atoms, and a hydroxyalkyl group having 1 to 18, and more preferably 1 to 6, carbon atoms, and an aminoalkyl group having 1 to 18 carbon atoms. The alkoxyalkyl group may preferably include, for example, methoxyethyl, ethoxymethyl, ethoxyethyl, ethoxypropyl, ethoxybutyl, propoxymethyl, propoxybutyl, i-propoxypentyl, t-butoxyethyl and hexyloxybutyl.

The halogenoalkyl group may preferably include, for example, chloromethyl, chloroethyl, bromoethyl, chloropropyl, chlorobutyl, chlorohexyl and chlorooctyl.

The hydroxyalkyl group may preferably include, for example, hydroxymethyl, hydroxyethyl, hydroxypropyl, hydroxybutyl, hydroxypentyl, hydroxyhexyl and hydroxyheptyl.

The aminoalkyl group may preferably include, for example, aminomethyl, acetylaminomethyl, dimethylaminomethyl, aminoethyl, acetylaminoethyl, dimethylaminoethyl, diethylaminoethyl, morpholinoethyl, piperidinoethyl, diethylaminopropyl, dipropylaminoethyl, acetylaminopropyl, aminobutyl and morpholinobutyl.

The substituted or unsubstituted aryl group may preferably include, for example, phenyl, naphthyl, tolyl, hydroxyphenyl and chlorophenyl.

The substituted or unsubstituted cycloalkyl group may preferably include, for example, cyclopentyl, cyclohexyl, cycloheptyl, methylcyclohexyl and dimethylcyclohexyl.

The substituted or unsubstituted aralkyl group may preferably include, for example, benzyl, phenethyl, tolylmethyl, hydroxybenzyl, 2-hydroxy-3-methylbenzyl and 2-hydroxy-3-t-butylbenzyl.

The substituted or unsubstituted alkoxyl group may preferably include, for example, methoxy, ethoxy, propoxy, butoxy, methoxyethoxy, methoxypropoxy, acetyloxyethoxy, acetyloxypropoxy, hydroxyethoxy and hydroxypropoxy.

Examples of the reducing agent represented by the formula (I) are shown below. Examples are by no means limited to these.

They are preferably 2,2'-dihydroxy-3,3'-di-t-butyl-5,5'-dimethylbiphenyl, 2,2'-dihydroxy-3,3'-di-t-butyl-5,5'-diethylbiphenyl, 2,2'-dihydroxy-3,3',5,5'-tetra-t-butylbiphenyl, 2,2'-dihydroxy-3,3',-di-t-butyl-5,5'-n-hexylbiphenyl, 2,2'-dihydroxy-3,3',-di-t-butyl-5,5'-diethoxybiphenyl, 2,2'-dihydroxy-3,3', -di-t-octyl-5,5'-diethylbiphenyl, 2-(2-hydroxy-3-t-butyl-5-ethylphenyl)-4-ethyl-6-cyclohexylphenol, 2-(2-hydroxy-3-t-butyl-5-methylphenyl)-4-ethyl-6-t-butylphenol, 2-(2-hydroxy-3-t-butyl-5-ethylphenyl)-4,6-dimethylphenol, 2,2'-dihydroxy-3,3',-di-t-butyl-5,5'-dichlorobiphenyl, 2,2'-dihydroxy-3,3',-dicyclohexyl-5,5'-dimethylbiphenyl, 2,2'-dihydroxy-3,3',-di-t-butyl-5,5'-dimethoxybiphenyl, 2,2'-dihydroxy-3,3',-diethoxy-5,5'-dimethylbiphenyl, 2,2'-dihydroxy-3,3',5,5'-tetra-t-octylbiphenyl, 2,2'-dihydroxy-3,3'-di-t-butyl-5,5'-diphenylbiphenyl, 2,2'-dihydroxy-3,3'-dibenzyl-5,5'-dipropylbiphenyl, 2,2'-dihydroxy-4,4'-dimethylbiphenyl, 2,2'-dihydroxy-3,3'-di-n-hexyl-5,5'-dimethylbiphenyl, 2,2'-dihydroxy-3,3'-dibromo-5,5'-dimethoxylbiphenyl, 2,2'-dihydroxy-3,3'-dibenzyl-5,5'-dimethylbiphenyl, 2,2'-dihydroxy-3,3'-diethyl-5,5'-dimethylbiphenyl, 2,2'-dihydroxy-3,3'-di-t-butyl-5,5'-dihexylbiphenyl, 2,2'-dihydroxy-3,3'-dichloro-5,5'-dimethylbiphenyl, 2,2'-dihydroxy-5,5'-di-t-butylbiphenyl, 2,2'-dihydroxy-3,3'-dimethylbiphenyl, 2,2'-dihydroxy-3,3'-di-t-butyl-4,4'-dimethyl-5,5'-dibromobiphenyl, 2-(2-hydroxy-3-t-butyl-5-methylphenyl)-4-methyl-6-n-hexylphenol, 2-(2-hydroxy-3-t-butyl-5-methylphenyl)-4-ethyl-6-t-butylphenol and 2-(2-hydroxy-3-t-butyl-5-ethylphenyl)-4-ethyl-6-n-dodecylphenol.

The reducing agent of the formula (I) may be used alone or may be used in combination of two or more kinds.

The silver halide used in the photosensitive material of the present invention may include silver chloride, silver bromide, silver chlorobromide, silver iodobromide and silver chloroiodobromide. These may have been subjected to chemical sensitization or spectral sensitization carried out on conventional photographic emulsions. As the chemical sensitization, sulfur sensitization, noble metal sensitization or reduction sensitization can be used. As the spectral sensitization, a method making use of hitherto well known spectral sensitizers can be applied.

The spectral sensitizer may include cyanine dyes, merocyanine dyes and trinuclear dyes. Those which can be preferably used are exemplified by 3,3'-dicarboxyethyl-2,2'-thiacarbocyanine iodide, 3,3'-diethyl-2,2'-thiacarbocyanine iodide, 3,3'-disulfoethyl-2,2'-thiacarbocyanine bromide and 3,3'-diethyl-2,2'-thiatricarbocyanine iodide.

The silver halide may have a uniform halogen composition in a grain, or a multiple structure having a different halogen composition in a grain. Two or more kinds of silver halide having different halogen composition, grain size, grain size distribution, etc. may be used in combination.

As the organic silver salt, it is possible to use organic acid silver salts and triazole silver salts as disclosed in SHASHIN KOGAKU NO KISO (Basic Photographic Engineering), First Edition, Korona-sha Co., Japan Photographic Society, 1982, The Volume of Non-silver salts, p. 247, or Japanese Patent Application Laid-open No. 59-55429. It is preferred to use silver salts with a low photosensitivity. They may include, for example, silver salts of aliphatic carboxylic acids, aromatic carboxylic acids, mercapto group or α-hydrogen-containing thiocarbonyl group compounds, and imino group-containing compounds.

The aliphatic carboxylic acids may include acetic acid, butyric acid, succinic acid, sebacic acid, adipic acid, oleic acid, linolic acid, lenolenic acid, tartaric acid, palmitic acid, stearic acid, behenic acid and camphor acid. In general, silver salts having a smaller number of carbon atoms are proportionally not stabler, and hence those having an appropriate number of carbon atoms (e.g., those having 16 to 26 carbon atoms) are preferred.

The aromatic carboxylic acids may include benzoic acid derivatives, quinolinic acid derivatives, naphthalene carboxylic acid derivatives, salicylic acid derivatives, gallic acid, tannic acid, phthalic acid, phenyl acetic acid derivatives, and pyromellitic acid.

The compounds having a mercapto or thiocarbonyl group may include 3-mercapto-4-phenyl-1,2,4-triazole, 2-mercaptobenzoimidazole, 2-mercapto-5-aminothiadiazole, 2-mercaptobenzothiazole, S-alkylthioglycolic acid (alkyl group carbon atom number of 12 to 22), dithiocarboxylic acids such as dithioacetic acid, thioamides such as thiostearoamide; 5-carboxy-1-methyl-2-phenyl-4-thiopyridine, mercaptotriazine, 2-mercaptobenzoxazole, mercaptooxadiazole, 3-amino-5-benzylthio-1,2,4-triazole, and mercapto compounds disclosed in U.S. Pat. No. 4,123,274.

The compounds having an imino group may typically include benzotriazole or derivatives thereof, described in Japanese Patent Publication No. 44-30270 or No. 45-18416, as exemplified by benzotriazole, alkyl-substituted benzotriazoles such as methylbenzotriazole, halogen-substituted benzotriazoles such as 5-chlorobenzotriazole, carboimidobenzotriazoles such as butylcarboimidobenzotriazole, nitrobenzotriazoles as disclosed in Japanese Patent Application Laid-open No. 58-118639, sulfobenzotriazole, carboxybenzotriazole or salts thereof, or hydroxybenzotriazole, disclosed in Japanese Patent Application Laid-open No. 58-115638, 1,2,4-triazole, disclosed in U.S. Pat. No. 4,220,709, or 1H-tetrazole, carbazole, saccharin, imidazole and derivatives thereof.

In addition to the reducing agent of the formula (I), the heat-developable photosensitive material of the present invention may contain any conventionally known reducing agents selected from the following groups (A) to (G).

(A) o-Bisphenols such as 2,2'-methylenebis(4-methyl-6-t-butylphenol), 2,2'-methylenebis(4-ethyl-6-t-butylphenol), 2,2'-methylenebis(4,6-di-t-butylphenol), 2,2'-methylenebis(4,6-dimethylphenol), 2,2'-(3,5,5-trimethylpentylidene)-bis(4,6-dimethylphenol), and 2,2'-(3,5,5-trimethylpentylidene)-bis(4,6-di-t-butylphenol).

(B) p-Bisphenols such as 4,4'-methylenebis(2,6-di-t-butylphenol), 4,4'-methylenebis(2-methyl-6-t-butylphenol), 4,4'-butylidenebis(2,6-di-t-butylphenol), 2,6-di-t-butyl-4-(3,5-dimethyl-4-hydroxybenzyl)phenol, 2,6-di-t-butyl-4-(3,5-diethyl-4-hydroxybenzyl)phenol, 2,6-di-t-butyl-4-(3,5-dimethoxy-4-hydroxybenzyl)phenol, 4,4'-benzylidenebis(2-methyl-6-t-butylphenol), and 4,4'-benzylidenebis(2-methyl-6-cylclohexylphenol).

(C) Phenols such as hydroquinone monomethyl ether, p-aminophenol, propyl gallate, hydroquinone, and 2,6-dichloro-4-benzenesulfonamidophenol.

(D) Binaphthols such as 1,1'-bi-2-naphthol and 1,1'-bi-4-methyl-2-naphthol.

(E) Bisnaphthols such as 4,4'-methylenebis(2-methyl-1-naphthol), 4,4'-methylenebis(2-ethyl-1-naphthol), and 4,4'-ethylidenebis(2-methyl-1-naphthol).

(F) Naphthols such as 1-naphthol, 4-chloro-1-naphthol, 4-methyl-1-naphthol, 4-methoxyl-1-naphthol, 2-ethyl-4-p-hydroxybenzylnaphthol, and 2-ethyl-4-p-tolylmethylnaphthol.

(G) Naphthylmethylphenols such as 2,6-dimethyl-4-(4-hydroxy-3-methylnaphthylmethyl)phenol, 2,6-diethyl-4-(4-hydroxy-3-methylnaphthylmethyl)phenol, 2,6-di-t-butyl-4-(4-hydroxy-3-methylnaphthylmethyl)phenol, 2,6-dimethyl-4-(4-hydroxynaphthylmethyl)phenol, and 2-methyl-6-t-butyl-4-(4-hydroxy-3-methylnaphthylmethyl)phenol.

The photosensitive material of the present invention may optionally contain a tone modifier as an additive. The tone modifier is used when the metallic silver produced as a result of reduction should be blackened. Effective tone modifiers depend on the types of the organic silver salt and reducing agent used. Most commonly available tone modifiers can be exemplified by phthalazinones, oxazinediones, cyclic imides, urazoles, 2-pyrazolin-5-ones, quinazolines, N-hydroxynaphthalimides, uracils, phthalazinediones and thiazolinediones.

A binder may also be appropriately contained in the photosensitive material of the present invention for the purpose of improving film forming properties and dispersibility.

The binder may include cellulose esters as exemplified by nitrocellulose, cellulose phosphate, cellulose sulfate, cellulose acetate, cellulose propionate, cellulose butyrate, cellulose myrystate, cellulose palmitate, cellulose acetate.propionate, and cellulose acetate.butyrate; cellulose esters as exemplified by methyl cellulose, ethyl cellulose, propyl cellulose, and butyl cellulose; vinyl resins as exemplified by polystyrene, polyvinyl chloride, polyvinyl acetate, polyvinyl butyral, polyvinyl acetal, polyvinyl alcohol, and polyvinyl pyrrolidone; copolymer resins as exemplified by a styrene/butadiene copolymer, a styrene/acrylonitrile copolymer, a styrene/butadiene/acrylonitrile copolymer, and a vinyl chloride/vinyl acetate copolymer; acrylic resins as exemplified by polymethyl methacrylate, polymethyl acrylate, polybutyl acrylate, polyacrylic acid, polymethacrylic acid, polyacrylamide, and polyacrylonitrile; polyesters as exemplified by polyethylene terephthalate; polyacrylate resins as exemplified by poly(4,4'-isopropylidene,diphenylene-co-1,4-cyclohexylenedimethylene carbonate), poly(ethylenedioxy-3,3'-phenylene thiocarbonate), poly(4,4'-isopropylidene, diphenylene carbonate-co-terephthalate), poly(4,4'-isopropylidene,diphenylene carbonate), poly(4,4'-secbutylidene,diphenylene carbonate), and poly(4,4'-isopropylidene,diphenylene carbonate-block-oxyethylene); polyamides; polyimides; epoxy resins; phenol resins; polyolefins as exemplified by polyethylene, polypropylene, and chlorinated polyethylene; and natural polymers such as gelatin.

In addition, an antifoggant, an alkali agent, a surface active agent etc. may also be added to the photosensitive layer in the present invention.

The above components in the photosensitive layer in the present invention may preferably be mixed in the following proportions.

The organic silver salt used may preferably be in an amount of from 0.3 g/m$^2$ to 30 g/m$^2$, particularly preferably 0.7 g/m$^2$ to 15 g/m$^2$, and more preferably 1.2 g/m$^2$ to 8 g/m$^2$.

The photosensitive silver halide should preferably be contained in an amount of from 0.001 mol to 2 mols, and more preferably from, 0.05 mol to 0.4 mol, per mol of the organic silver salt. The reducing agent represented by the formula (I) should preferably be contained in an amount of from 0.05 mol to 3 mols, and more preferably from 0.2 mol to 1.5 mols, per mol of the organic silver salt. In the case when any reducing agent other than that represented by the formula (I) is used, the reducing agent other than that represented by the formula (I) may preferably be contained in an amount of from 0.01 mol to 3 mols, and more preferably from 0.05 mol to 1.5 mols, per mol of the organic silver salt.

In the case when the tone modifier is used, it may be used in an amount ranging from about 0.0001 mol to about 2 mols, and preferably from about 0.0005 mol to about 1.5 mol, per mol of the organic silver salt.

As the support used in the present invention, extensively various kinds of supports can be used. Typical supports can be exemplified by cellulose nitrate films, cellulose ester films, polyvinylacetal films, polystyrene films, polyethylene terephthalate films, polycarbonate films, baryta paper, and glass sheets, paper, metal sheets or the like. The paper is suitable when a support paper having been subjected to hydrophobic treatment comprises an emulsion layer in which an organic solvent is used. It is also suitable to use paper having been sized using a polysaccharide or the like.

The heat-developable photosensitive material of the present invention may be provided with an antistatic layer or a conductive layer. It may also be incorporated with an anti-halation dye.

The heat-developable photosensitive material used in working the present invention may further optionally be incorporated with a matting agent including, for example, starch, titanium dioxide, zinc oxide and silica. It may also be incorporated with an optical whitening agent, including, for example, stilbenes, triazines, oxazoles, and cumarin optical whitening agents.

In order to improve transparency, increase image density and improve raw stock stability of the heat-developable photosensitive material, and in some instances in order to improve heat resistance of the photosensitive material, a photosensitive layer may optionally be provided thereon with a protective layer. The protective layer may suitably have a layer thickness of from 1 micron to 20 microns. A layer with a thickness excessively smaller than this may have no effect stated above, and a layer with an excessively large thickness can give no particular effect, only resulting in a high cost. Polymers used in the protective layer may preferably be those being heat-resistant, colorless and soluble in solvents, and may include polyvinyl chloride, polyvinyl acetate, copolymers of vinyl chloride and vinyl acetate (preferably containing 50 mol % or more of vinyl chloride), polyvinyl butyral, polystyrene, polymethyl methacrylate, benzyl cellulose, ethyl cellulose, cellulose acetate-butyrate, cellulose diacetate, cellulose triacetate, polyvinylidene chloride, chlorinated polypropylene, polyvinylpyrrolidone, cellulose propionate, polyvinyl formal, cellulose acetate butyrate, polycarbonate, and cellulose acetate propionate. They may also include gelatin, gelatin derivatives such as phthalated gelatin, acrylamide polymers, polyisobutylene, a butadiene-styrene copolymer (with any desired monomer ratio), and polyvinyl alcohol.

Polymers preferable for the protective layer are those having a heat resistance of 115° C. or above, a refractive index of 1.45 or more at 20° C.

The heat-developable photosensitive material of the present invention may have the photosensitive layer, conductive layer, protective layer, etc. having been respectively individually formed, in the case of which each of these layers can be provided by various coating processes. Coating processes that form the respective layers can be exemplified by dipping, air-knife coating, curtain coating, and extrusion coating making use of a hopper as disclosed in U.S. Pat. No. 2,681,294. If necessary, two or more layers can be simultaneously coated.

The heat-developable photosensitive material is subjected to imagewise exposure and heating (heat development), and a pattern corresponding to the difference in light-absorption can be formed utilizing light-absorbing properties of the image thus formed. More specifically, light is absorbed at the imagewise exposed area and light is less absorbed at the imagewise unexposed area, where there are differences in light-absorbing properties, and a pattern corresponding therewith can be formed.

Utilizing the above difference in light-absorbing properties, it is also possible for the heat-developable photosensitive material of the present invention to form a pattern comprised of a polymerized area and an unpolymerized area (hereinafter "polymerized-unpolymerized pattern"). That is, the photosensitive layer according to the present invention may be incorporated with a polymerizable polymer precursor and a photopolymerization initiator, followed by exposure, heating (heat development) and polymerization exposure, so that the polymerized-unpolymerized pattern can be formed. The mechanism by which the polymerized-unpolymerized pattern is formed is that no polymerization proceeds in the imagewise exposed area because of the light absorption attributable to the silver, and the polymerization proceeds in the imagewise unexposed area.

The polymerizable polymer precursor and the photopolymerization initiator may be contained in the photosensitive layer. Alternatively, a polymerizing layer containing the polymerizable polymer precursor and photopolymerization initiator may be provided separately from the photosensitive layer. The photosensitive layer and the polymerizing layer may be formed in laminae in the order of the polymerizing layer and the photosensitive layer from the support side, or in the order of the photosensitive layer and the polymerizing layer from the support side. Alternatively, they may hold a support between them, one side of which the photosensitive layer is provided and the other side of which the polymerizing layer is provided.

The photopolymerization initiator used in the photosensitive material of the present invention includes, for example, carbonyl compounds, sulfur compounds, halogen compounds, photopolymerization initiators of a redox type, and initiators of a peroxide type sensitized with a dye such as pyrylium.

Stated specifically, the carbonyl compounds may include diketones as exemplified by benzyl, 4,4'-dimethoxybenzyl, diacetyl, and camphorquinone; benzophenones as exemplified by 4,4'-bis(diethylamino)benzophenone, and 4,4'-dimethoxybenzophenone; acetophenones as exemplified by acetophenone, and 4-methoxyacetophenone; benzoin alkyl ethers; thioxanthones as exemplified by 2-chlorothioxanthone, 2,4-dichlorothioxanthone, 2,4-diethylthioxanthone, and thioxanthone-3-carboxylic acid-$\beta$-methoxy ethyl ester; chalcones and styrylketones having a dialkylamino group; and coumarins as exemplified by 3,3'-carbonylbis(7-methoxycoumarin), and 3,3'-carbonylbis(7-diethylaminocoumarin).

The sulfur compounds include, for example, dibenzothiazolyl sulfide, decylphenyl sulfide, and disulfides.

The halogen compounds include, for example, carbon tetrabromide, quinolinesulfonyl chloride, and S-triazines having a trihalomethyl group.

The photopolymerization initiators of redox type include those used in combination of a trivalent iron ionic compound (as exemplified by ferric ammonium citrate) with a peroxide, and those used in combination of a photoreducing coloring matter such as riboflavin or Methylene Blue with a reducing agent such as triethanolamine or ascorbic acid.

In the photopolymerization initiator described above (including the sensitizer), two or more photopolymerization initiators can also be used in combination to effect a more efficient photopolymerization reaction.

Such combination of the photopolymerization initiators includes a combination of chalcones having a dialkylamino group and styrylketones or coumarins, with S-triazines having a trihalomethyl group or camphorquinone.

As the polymerizable polymer precursor used in the photosensitive material of the present invention, a compound having at least one reactive vinyl group in its molecule can be utilized.

The reactive vinyl group in these compounds may include substituted or unsubstituted vinyl groups having polymerization reactivity, as exemplified by styrene vinyl groups, acrylic acid vinyl groups, methacrylic acid vinyl groups, allyl vinyl groups, and vinyl ethers, as well as ester vinyl groups such as vinyl acetate.

Specific examples of the polymerizable polymer precursor satisfying such conditions are as follows.

They may include monovalent monomers as exemplified by styrene, methylstyrene, chlorostyrene, bromostyrene, methoxystyrene, dimethylaminostyrene, cyanostyrene, nitrostyrene, hydroxystyrene, aminostyrene, carboxystyrene, acrylic acid, methyl acrylate, ethyl acrylate, cyclohexyl acrylate, acrylamide, methacrylic acid, methyl methacrylate, ethyl methacrylate, propyl methacrylate, butyl methacrylate, phenyl methacrylate, cyclohexyl methacrylate, vinyl pyridine, N-vinylpyrrolidone, N-vinylimidazole, 2-vinylimidazole, N-methyl-2-vinylimidazole, propyl vinyl ether, butyl vinyl ether, isobutyl vinyl ether, $\beta$-chloroethyl vinyl ether, phenyl vinyl ether, p-methylphenyl vinyl ether, and p-chlorophenyl vinyl ether; divalent monomers as exemplified by divinylbenzene, distyryl oxalate, distyryl malonate, distyryl succinate, distyryl glutarate, distyryl adipate, distyryl maleate, distyryl fumarate, distyryl $\beta,\beta'$-dimethylglutarate, distyryl 2-bromoglutarate, distyryl $\alpha,\alpha'$-dichloroglutarate, distyryl terephthalate, oxalic acid di(ethyl acrylate), oxalic acid di(methyl acrylate), malonic acid di(ethyl acrylate), malonic acid di(methyl ethyl acrylate), succinic acid di(ethyl acrylate), glutaric acid di(ethyl acrylate), adipic acid di(ethyl acrylate), maleic acid di(ethyl acrylate), fumaric acid di(ethyl acrylate), $\beta,\beta'$-dimethylglutaric acid di(ethyl acrylate), ethylenediacrylamide, propylenediacrylamide, 1,4-phenylenediacrylamide, 1,4-phenylenebis(oxyethyl acrylate), 1,4-phenylenebis(oxymethyl ethyl acrylate), 1,4-bis(acryloyloxyethoxy)cyclohexane, 1,4-bis(acryloyloxymethylethoxy)cyclohexane, 1,4-bis(acryloyloxyethoxycarbamoyl)benzene, 1,4-bis(acryloyloxymethylethoxycarbamoyl)benzene, 1,4-bis(acryloyloxyethoxycarbamoyl)cyclohexane, bis(acryloyloxyethoxycarbamoylcyclohexyl)methane, oxalic acid di(ethyl methacrylate), oxalic acid di(methyl ethyl methacrylate), malonic acid di(ethyl methacrylate), malonic acid di(methyl ethyl methacrylate), succinic acid di(ethyl methacrylate), succinic acid di(methyl ethyl methacrylate), glutaric acid di(ethyl methacrylate), adipic acid di(ethyl methacrylate), maleic acid di(ethyl methacrylate), fumaric acid di(ethyl methacrylate), fumaric acid di(methyl ethyl methacrylate), $\beta,\beta'$-dimethylglutaric acid di(ethyl methacrylate), 1,4-phenylenebis(oxyethyl methacrylate), and 1,4-bis(methacryloyloxyethoxy) cyclohexane acryloyloxyethoxyethyl vinyl ether; trivalent monomers as exemplified by pentaerythritol triacrylate, pentaerythritol trimethacrylate, pentaerythritol tri(hydroxystyrene), dipentaerythritol hexaacrylate, cyanuric acid triacrylate, cyanuric acid trimethacrylate, 1,1,1-trimethylolpropane triacrylate, 1,1,1-trimethylolpropane trimethacrylate, cyanuric acid tri(ethyl acrylate), 1,1,1-trimethylolpropane tri(ethyl acrylate), cyanuric acid tri(ethyl vinyl ether), a condensate of 1,1,1-trimethylolpropane(toluenediisocyanate) with hydroxyethyl acrylate, and a condensate of 1,1,1-trimethylolpropane tri(hexanediisocyanate) with p-hydroxystyrene; tetravalent monomers as exemplified by ethylenetetraacrylamide, and propylenetetraacrylamide; and hexavalent monomers such as dipentaerythritol hexaacrylate.

The above polymerizable polymer precursors may be used in combination of two or more kinds.

In the instance where the polymerizable polymer precursor and the photopolymerization initiator are contained in the heat-developable photosensitive material of the present invention, the photopolymerization initiator may preferably be contained in an amount of from 0.01 mol to 10 mols, and more preferably from 0.5 mol to 3.0 mols, per mole of the reducing agent. The photopolymerization initiator should preferably be in an amount of from 0.1 part by weight to 30 parts by weight, and more preferably from 0.5 part by weight to 10 parts by weight, based on 100 parts by weight of the polymerizable polymer precursor.

In the present invention, the photosensitive layer may preferably have a thickness of from 0.1 $\mu$m to 50 $\mu$m, more preferably from 1 $\mu$m to 30 $\mu$m, and particularly preferably from 2 $\mu$m to 20 $\mu$m. In the case when the polymerizing layer is provided separately from the photosensitive layer, the polymerizing layer may have the thickness in the same range as the range of the thickness of the photosensitive layer.

As light sources used in the steps of imagewise exposure and polymerization exposure, usable are, for example, sunlight, tungsten lamps, mercury lamps, halogen lamps, xenon lamps, fluorescent lamps, LEDs, and lasers, and the wavelength of the light used in these steps may be the same or different. Even if the light having the same wavelength is used, the latent image can be sufficiently written with use of light having an intensity of the level that does not cause photopolymerization in the step of imagewise exposure, since the silver halide usually has a sufficiently higher photosensitivity than the photopolymerization initiator. For example, in the step of imagewise exposure, the exposure may be carried out using light that may give about 1 mJ/cm$^2$ or less at the surface of the photosensitive material. In the step of polymerization exposure, the exposure may be carried out using light that may give about 500 mJ/cm$^2$ or less at the surface of the photosensitive material.

Various kinds of means are available as a means of heat-developing the photosensitive material of the present invention. For example, the photosensitive material may be brought into contact with a simple heating plate. Alternatively, it may be brought into contact with a heated drum. In some instances, it may also be passed through a heated space. It may also be heated by high-frequency heating or using laser beams. It is suitable to carry out the heating at a temperature of from 80° C. to 160° C., preferably from 100° C. to 160° C., and more preferably from 110° C. to 150° C. The heating time may be elongated or shortened, whereby a higher temperature or lower temperature within the above range can be used. Developing time may be usually from about 1 second to about 60 seconds, and preferably from 3 seconds to 20 seconds.

EXAMPLES

The present invention will be described below in greater detail by giving Examples. In the following, "part(s)" indicates "part(s) by weight".

EXAMPLE 1

A photosensitive material dispersion with the following composition was prepared using a homomixer under safelight.

| | |
|---|---|
| Polyvinyl butyral | 3.0 parts |
| Silver behenate | 2.5 parts |
| Behenic acid | 1.0 part |
| Silver bromide | 0.5 part |
| Phthalazinone | 0.5 part |
| Homophthalic acid | 0.3 part |
| 2,2'-Dihydroxy-3,3',5,5'-tetra-t-butylbiphenyl | 2.3 parts |
| Xylene | 30 parts |
| n-Butanol | 30 parts |

The above photosensitive material dispersion was coated on a 6 μm thick polyethylene terephthalate film (PET film) in a dried-coating thickness of 5 μm to form a photosensitive layer. On this photosensitive layer, a polyvinyl alcohol layer (PVA layer) was provided in a dried-coating thickness of 2 μm. Heat-developable photosensitive material A of the present invention was thus produced.

To the photosensitive layer of the heat-developable photosensitive material A thus produced, a mask film was superposed, which were then exposed to 1,000 lux light for 10 seconds using a tungsten lamp as a light source. The mask film used was simply comprised of light-transmitting areas and light-screening areas. The photosensitive material A was passed through a heat-developing machine adjusted to 130° C. for a heating time of 10 seconds. As a result, the imagewise exposed area was thermally developed and an image was formed.

For the photosensitive material A thus imagewise exposed and heated, optical density of the imagewise exposed area (maximum optical density) and that of the imagewise unexposed area (fog density) were measured. They were measured using a spectrophotometer UV-3100S, manufactured by Shimadzu Corporation. The optical density measured was a value obtained under light with a wavelength of 550 nm. The light used in the measurement of the optical density was shed in a spot of 0.5 mm×7.0 mm.

Results of measurement were as follows:
Maximum optical density (O.D.max)=1.93
Fog density (O.D.min)=0.18

Spectral properties of the imagewise exposed area was also measured. The above UV3100S was also used in the measurement of the optical properties. Results of measurement are shown in FIG. 1.

As is clear from the spectral properties shown in FIG. 1, the imagewise exposed area of the heat-developable photosensitive material A according to the present invention was a less-reddish, bluish pitch-black image.

EXAMPLE 2

A dispersion with the following composition was prepared using a homomixer under safelight.

| | |
|---|---|
| Polyvinyl butyral | 1.0 part |
| Polymethyl methacrylate | 2.5 parts |
| Silver behenate | 2.5 parts |
| Behenic acid | 1.0 part |
| Silver iodobromide | 0.6 part |
| Azelaic acid | 0.3 part |
| Phthalazinone | 0.6 part |
| 2,2'-Dihydroxy-3,3',5,5'-tetra-t-octylbiphenyl | 2.5 parts |
| Xylene | 30 parts |
| n-Butanol | 30 parts |

To this dispersion, a solution prepared by dissolving 0.003 part of spectral sensitizer represented by the following structural formula (II) in 0.1 part of N,N-dimethylformamide was added to give a photosensitive material dispersion.

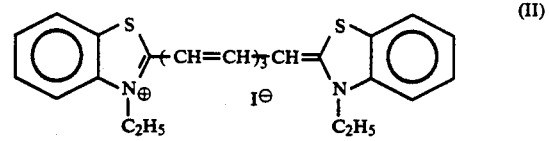
(II)

Heat-developable photosensitive material B of the present invention was produced in the same manner as in Example 1 except that this photosensitive material dispersion was used.

This photosensitive material B was exposed to light using a 780 nm semiconductor laser at an illumination of 80 μJ/cm$^2$ on the image surface, followed by heat-development at 125° C. for 10 seconds. As a result, a good black and white image with a good contrast was obtained.

For the photosensitive material B on which the image was thus formed, the maximum optical density and fog density were measured in the same manner as in Example 1. Results of measurement were as follows:
Maximum optical density (O.D.max)=1.80
Fog density (O.D.min)=0.21

COMPARATIVE EXAMPLE 1

Heat-developable photosensitive material C was produced in the same manner as in Example 1 except that in the photosensitive material dispersion prepared therein 2.3 parts of the reducing agent 2,2'-dihydroxy-3,3',5,5'-tetra-t-butylbiphenyl was replaced with 2.3 parts of 4,4'-dihydroxy-3,3',5,5'-tetra-t-butylbiphenyl.

On the photosensitive material C thus produced, an image was formed in the same manner as in Example 1. As a result, the image formed had a poor uniformity in density at the imagewise exposed area and a poor transparency at the imagewise unexposed area. For the photosensitive material C on which the image was thus formed, the maximum optical density and fog density were measured in the same manner as in Example 1 to obtain the results as shown below.

Maximum optical density (O.D.max)=1.67
Fog density (O.D.min)=0.29

Next, photosensitive material C and photosensitive material A of Example 1 on the both of which images have not been formed were held for 40 hours in a thermo-hygrostat adjusted to a temperature of 50° C. and a humidity of 70% RH. Thereafter, the photosensitive materials C and A were taken out of the thermo-hygrostat, and images were formed thereon in the same manner as in Example 1. For each photosensitive material, the maximum optical density and fog density were also measured in the same manner as in Example 1. Results of measurement were as shown in Table 1.

TABLE 1

|  | Maximum optical density (O.D. max) | Fog density (O.D. min) |
| --- | --- | --- |
| Photosensitive material A | 1.75 | 0.23 |
| Photosensitive material C | 1.48 | 0.40 |

As is clear from Table 1 above, the photosensitive material A showed a good raw stock stability.

On the photosensitive material C and the photosensitive material A of Example 1 (those on which images have not been formed), images were formed in the same manner as in Example 1. In this image formation, a mask film was used in which light-transmitting areas and light-screening areas are alternately formed. The densities at the light-transmitting areas or light-screening areas will be seen from FIGS. 2 and 3 described later.

Optical densities were measured with regard to the photosensitive materials A and C on which images were thus formed. The optical densities were measured using a microscopic spectrophotometer UMSP, manufactured by ZEISS CO., which were measured while the photosensitive material A or C was moved with respect to this microscopic spectrophotometer. The photosensitive material A or C was made to move in the direction falling at right angles with the longitudinal direction of the imagewise exposed area. The optical density was a value obtained under light with a wavelength of 550 nm. The light used in the measurement of the optical density was shed in a spot diameter of 5 $\mu$m.

Figure 2:
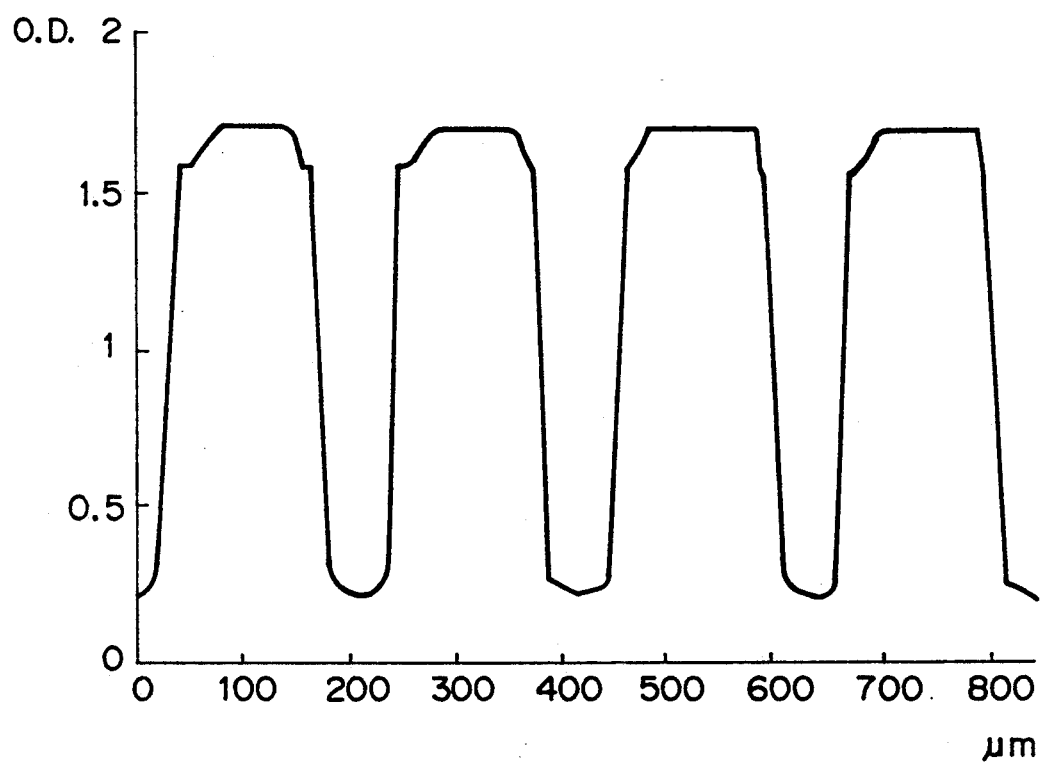
FIG. 2 is a graph to show optical densities at an imagewise exposed area and an imagewise unexposed area of the photosensitive material A according to the present invention, prepared in Example 1.
Figure 3:
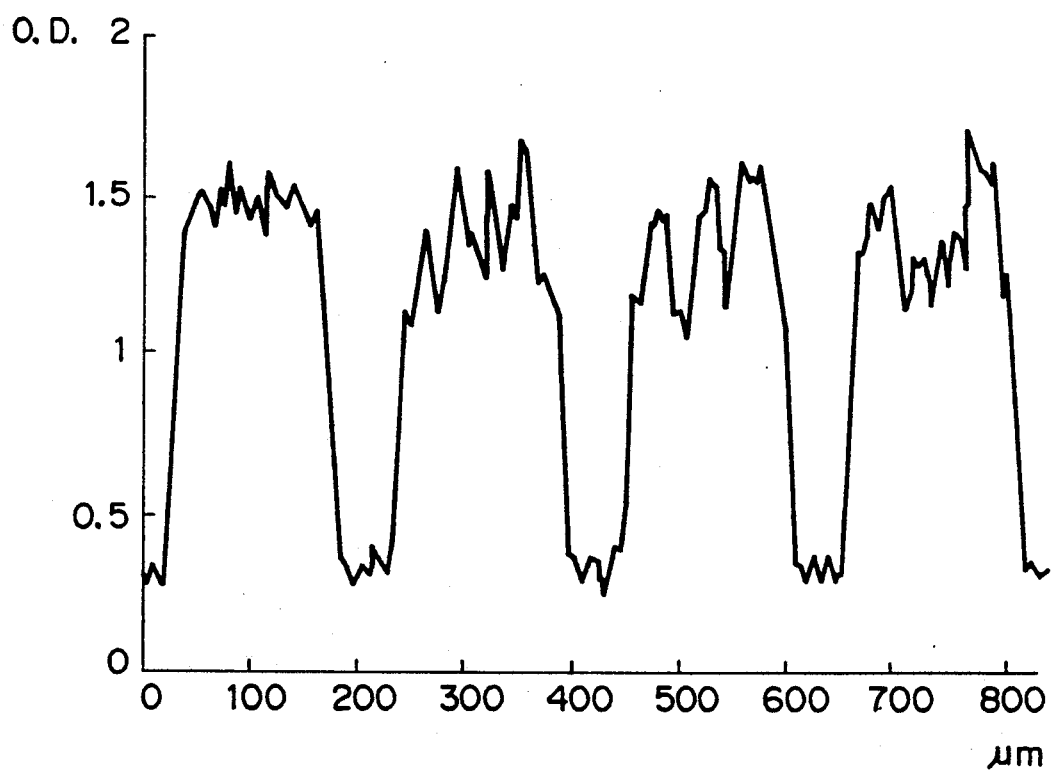
FIG. 3 is a graph to show optical densities at an imagewise exposed area and an imagewise unexposed area of photosensitive material C prepared in Comparative Example 1.

Results of measurement for the photosensitive material A are shown in FIG. 2. Results of measurement for the photosensitive material C are shown in FIG. 3. In FIGS. 2 and 3, optical density is plotted as abscissa and scanning distance as ordinate.

As is seen from FIGS. 2 and 3, the photosensitive material A of the present invention was uniform in density at the imagewise exposed area and also was well transparent at the imagewise unexposed area, showing a very good resolution. On the other hand, the photosensitive material C showed a poor uniformity in density at the imagewise exposed area and also a poor transparency at the imagewise unexposed area.

EXAMPLES 3 TO 6

Heat-developable photosensitive materials D, E, F and G of the present invention were produced in the same manner as in Example 1 except that in the photosensitive material dispersion prepared therein 2.3 parts of the reducing agent 2,2'-dihydroxy-3,3',5,5'-tetra-t-butylbiphenyl was replaced with the reducing agents, respectively, as shown in Table 2. The amount of each reducing agent is also shown in Table 2.

On these photosensitive materials D, E, F and G, images were formed in the same manner as in Example 2 except that the heat-development time was changed to 12 seconds. As a result, black and white images with a good contrast were formed on all the photosensitive materials.

For each photosensitive material on which the image was thus formed, the maximum optical density (O.D.max) and fog density (O.D.min) were measured in the same manner as in Example 1. Results of measurement are shown in Table 2.

TABLE 2

| Photosensitive material | Reducing agent | Amount of reducing agent (pbw) | O.D. max/ O.D. min |
| --- | --- | --- | --- |
| Example 3: D | 2,2'-Dihydroxy-3,3'-di-t-butyl-5,5'-dimethylbiphenyl | 2.2 | 1.82/0.20 |
| Example 4: E | 2,2'-Dihydroxy-3,3'-di-t-butyl-5,5'-dimethoxylbiphenyl | 2.2 | 1.78/0.22 |
| Example 5: F | 2,2'-Dihydroxy-3,3'-dihexyl-5,5'-dimethylbiphenyl | 2.3 | 1.70/0.21 |
| Example 6: G | 2,2'-Dihydroxy-3,3'-dibenzyl-5,5'-dipropylbiphenyl | 2.4 | 1.80/0.24 | pbw: parts by weight

EXAMPLE 7

A dispersion with the following composition was prepared using a homomixer under safelight.

| | |
| --- | --- |
| Polyvinyl butyral | 1.9 parts |
| Silver behenate | 2.5 parts |
| Silver bromide | 0.2 part |
| Behenic acid | 0.5 part |
| Azelaic acid | 0.2 part |
| Phthalazinone | 0.75 part |
| 2-(2-Hydroxy-3-t-butyl-5-methylphenyl)-4-ethyl-6-t-butylphenol | 2.2 parts |
| Xylene | 30 parts |
| n-Butanol | 20 parts |

The resulting photosensitive material dispersion was coated on a 6 $\mu$m thick PET film in a dried-coating thickness of 8 $\mu$m to form a photosensitive layer. On this photosensitive layer, a 2 $\mu$m thick polyvinyl alcohol layer was provided. On the side opposite to the side on which the photosensitive layer was formed, the PET film was previously provided with a 6 μm thick polymerizing layer. This polymerizing layer was composed of 1.75 parts of ARONIX M 6300 (trade name; available from Toagosei Chemical Industry Co., Ltd.), 2.25 parts of polyester resin (trade name: VYLON #200; available from Toyobo Co., Ltd.), 0.2 part of chlorinated rubber (510; available from Sanyo-Kokusaku Pulp Co., Ltd.), 0.37 part of 2,4-diethylthioxanthone and 0.37 part of ethyl p-diethylaminobenzoate.

A copper sheet was laminated to this polymerizing layer to give heat-developable photosensitive material H of the present invention.

A mask was superposed to the photosensitive layer of the photosensitive material H, followed by imagewise exposure using a tungsten lamp, at 1,000 lux for 10 seconds. Thereafter, the mask was removed from the photosensitive material, which was then heated for 10 seconds using a drum type heater adjusted to 125° C. Next, the photosensitive material was subjected to uniform polymerization exposure for 2 seconds from the side of the photosensitive layer of the photosensitive material H, using an ultrahigh-pressure mercury lamp (USH-500D; manufactured by Ushio Inc.). The polymerization exposure was carried out setting the ultrahigh-pressure mercury lamp 80 cm apart from the photosensitive materials. Thereafter, for the photosensitive material H, the PET film was separated from the copper sheet. As a result, the part at which the polymerizing layer had polymerized (hereinafter "polymerized areas") remained on the copper sheet, and the part at which the polymerizing layer had not polymerized (hereinafter "unpolymerized areas" remained on the PET film. The polymerized areas thus formed corresponded with the part not exposed to light at the time of imagewise exposure and the unpolymerized area corresponded with the part exposed to light at the time of imagewise exposure.

What is claimed is:

1. A heat-developable photosensitive material comprises a support and provided thereon a photosensitive layer containing at least an organic silver salt, a silver halide and a reducing agent represented by the following formula (I):

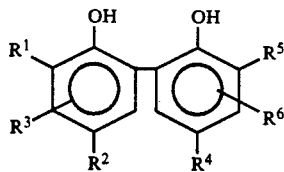

wherein $R^1$, $R^2$, $R^3$, $R^4$, $R^5$ and $R^6$ each represent a hydrogen atom, a halogen atom, a substituted or unsubstituted alkyl group, a substituted or unsubstituted aryl group, a substituted or unsubstituted cycloalkyl group, a substituted or unsubstituted aralkyl group or a substituted or unsubstituted alkoxyl group, and $R^1$, $R^2$, $R^3$, $R^4$, $R^5$ and $R^6$ may be the same or different from one another.

2. The heat-developable photosensitive material according to claim 1, wherein said $R^1$, $R^2$, $R^3$, $R^4$, $R^5$ and $R^6$ each represent a halogen atom, a substituted or unsubstituted alkyl group, a substituted or unsubstituted cycloalkyl group, a substituted or unsubstituted aralkyl group or a substituted or unsubstituted alkoxyl group.

3. The heat-developable photosensitive material according to claim 2, wherein said $R^1$ and $R^5$ each represent a substituted or unsubstituted alkyl group.

4. The heat-developable photosensitive material according to claim 3, wherein said alkyl group is a branched alkyl group.

5. The heat-developable photosensitive material according to claim 1, wherein said reducing agent represented by the formula (I) is contained in an amount of from 0.05 mol to 3 mols per mol of said organic silver salt.

6. The heat-developable photosensitive material according to claim 1, wherein said photosensitive layer further contains a polymerizable polymer precursor and a photopolymerization initiator.

7. The heat-developable photosensitive material according to claim 1, which further comprises a polymerizing layer containing a polymerizable polymer precursor and a photopolymerization initiator.

8. An image-forming method comprising:
subjecting to imagewise exposure and heating to form an image, a heat-developable photosensitive material which comprises a support and provided thereon a photosensitive layer containing at least an organic silver salt, a silver halide and a reducing agent represented by the following formula (I):

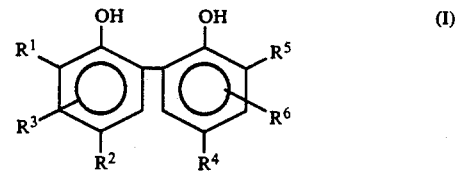

wherein $R^1$, $R^2$, $R^3$, $R^4$, $R^5$ and $R^6$ each represent a hydrogen atom, a halogen, a substituted or unsubstituted alkyl group, a substituted or unsubstituted aryl group, a substituted or unsubstituted cycloalkyl group, a substituted or unsubstituted aralkyl group or a substituted or unsubstituted alkoxyl group, and $R^1$, $R^2$, $R^3$, $R^4$, $R^5$ and $R^6$ may be the same or different from one another.

9. An image-forming method comprising in sequence the steps of: subjecting to (a) imagewise exposure; (b) heating; and (c) polymerizing exposure, a heat-developable photosensitive material comprising a support and provided thereon a photosensitive layer containing at least a polymerizable polymer precursor, a photopolymerizable initiator, an organic silver salt, a silver halide and a reducing agent represented by the following formula (I):

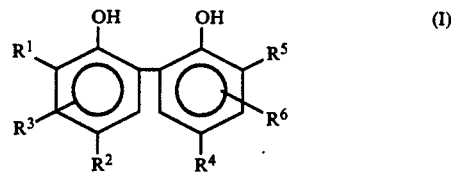

wherein $R^1$, $R^2$, $R^3$, $R^4$, $R^5$ and $R^6$ each represent a hydrogen atom, a halogen, a substituted or unsubstituted alkyl group, a substituted or unsubstituted aryl group, a substituted or unsubstituted cycloalkyl group, a substituted or unsubstituted aralkyl group or a substituted or unsubstituted alkoxyl group, and $R^1$, $R^2$, $R^3$, $R^4$, $R^5$ and $R^6$ may be the same or different from one another.

10. The method of claim 9 including employing a photosensitive material in which said polymerizable polymer precursor and said photopolymerizable initiator are present in a polymerizing layer.

* * * * *

UNITED STATES PATENT AND TRADEMARK OFFICE
CERTIFICATE OF CORRECTION

PATENT NO. : 5,262,295
DATED : November 16, 1993
INVENTOR(S) : HIROMI TANAKA, ET AL.

It is certified that error appears in the above-identified patent and that said Letters Patent is hereby corrected as shown below:

COLUMN 1

Line 23, "give anxiety for influence on human bodies" should read --be toxic or harmful to humans--.
    Line 54, "more improve them" should read --better--.
    Line 57, "its" should read --their--.

COLUMN 12

Line 17, "was" should read --were--.

Signed and Sealed this

Fourteenth Day of June, 1994

Attest:

BRUCE LEHMAN

Attesting Officer     Commissioner of Patents and Trademarks